(12) United States Patent
Lin et al.

(10) Patent No.: US 12,696,810 B2
(45) Date of Patent: Jul. 28, 2026

(54) PACKAGE STRUCTURE AND METHOD FOR FORMING THE SAME

(71) Applicant: Taiwan Semiconductor Manufacturing Company, Ltd., Hsinchu (TW)

(72) Inventors: Chia-Chia Lin, Kaohsiung City (TW); Chih-Hsin Lu, Tainan City (TW); Chung-Hao Tsai, Changhua County (TW); Hsing-Kuo Hsia, Hsinchu County (TW); Chuei-Tang Wang, Taichung City (TW); Chen-Hua Yu, Hsinchu City (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 602 days.

(21) Appl. No.: 18/318,447

(22) Filed: May 16, 2023

(65) Prior Publication Data

US 2024/0387489 A1 Nov. 21, 2024

(51) Int. Cl.
H10W 90/00 (2026.01)
H10B 80/00 (2026.01)
(Continued)

(52) U.S. Cl.
CPC ............ H10W 90/00 (2026.01); H10B 80/00 (2023.02); H10W 70/095 (2026.01); H10W 74/012 (2026.01); H10W 74/131 (2026.01); H10W 74/15 (2026.01); H10W 80/312 (2026.01); H10W 80/327 (2026.01); H10W 90/794 (2026.01)

(58) Field of Classification Search
CPC ...... H10B 80/00; H10P 72/74; H10W 70/095; H10W 70/611; H10W 70/635; H10W 70/685; H10W 72/072; H10W 72/20; H10W 74/012; H10W 74/131; H10W 74/15; H10W 80/312; H10W 80/327; H10W 90/00; H10W 90/401; H10W 90/701; H10W 90/794
See application file for complete search history.

(56) References Cited

U.S. PATENT DOCUMENTS 11,282,759 B2 * 3/2022 Hsu .......................... H10P 72/74
2014/0042463 A1 2/2014 Uemura et al.
(Continued)

FOREIGN PATENT DOCUMENTS

CN 115515027 A 12/2022
TW 201812360 A 4/2018
(Continued)

*Primary Examiner* — Telly D Green
(74) *Attorney, Agent, or Firm* — Birch, Stewart, Kolasch & Birch, LLP

(57) ABSTRACT

A package structure is provided, and includes an interposer, a control unit, a plurality of computing units, a signal transmission layer, and an electric-optical material. The control unit is bonded to the interposer. The computing units are disposed around and connected to the control unit. The signal transmission layer is formed in the control unit and the computing units. The electric-optical material is formed in the control unit and the computing units, and the electric-optical material overlaps the signal transmission layer.

20 Claims, 17 Drawing Sheets

(51) Int. Cl.
  *H10W 70/05*    (2026.01)
  *H10W 74/01*    (2026.01)
  *H10W 74/10*    (2026.01)
  *H10W 74/15*    (2026.01)
  *H10W 80/00*    (2026.01)

(56)      References Cited

U.S. PATENT DOCUMENTS

| | | | |
|---|---|---|---|
| 2020/0273843 A1* | 8/2020 | Zhong | H10W 70/09 |
| 2021/0096311 A1* | 4/2021 | Yu | G02B 6/12004 |
| 2021/0271020 A1* | 9/2021 | Islam | G02B 6/12004 |
| 2023/0207438 A1* | 6/2023 | Chou | H10W 70/095 |
| | | | 257/738 |
| 2023/0207519 A1* | 6/2023 | Wu | H10W 70/095 |
| | | | 257/774 |

FOREIGN PATENT DOCUMENTS

| | | |
|---|---|---|
| TW | 202113410 A | 4/2021 |
| TW | 202133353 A | 9/2021 |

* cited by examiner

PACKAGE STRUCTURE AND METHOD FOR FORMING THE SAME

BACKGROUND

The semiconductor industry continues to improve the integration density of various electronic components (e.g., transistors, diodes, resistors, capacitors, etc.) by continual reductions in minimum feature size, which allow more components to be integrated into a given area. The individual dies are typically packaged separately. A package not only provides protection for semiconductor devices from environmental contaminants, but also provides a connection interface for the semiconductor devices packaged therein.

Three dimensional integrated circuits (3DICs) are a recent development in semiconductor packaging in which multiple semiconductor dies are stacked upon one another, such as package-on-package (POP) and system-in-package (SiP) packaging techniques. Some 3DICs are prepared by placing dies over dies on a semiconductor wafer level. 3DICs provide improved integration density and other advantages, such as faster speeds and higher bandwidth, because of the decreased length of interconnects between the stacked dies, for example. However, there are many challenges related to 3DICs.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
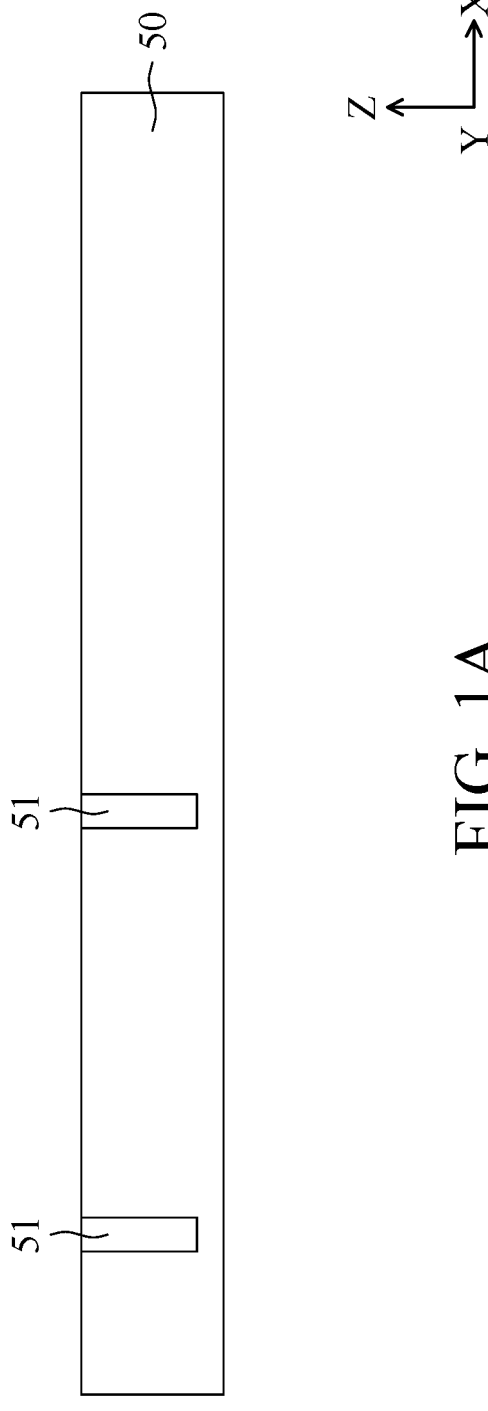
FIGS. 1A-1D are cross-sectional views illustrating various stages of forming a package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of package structures and method for forming the same are provided. The package structure includes a control unit and a plurality of computing units surrounding the control unit. Accordingly, the connection between the control unit and each computing unit may be shortened, the manufacturing cost may be reduced. In addition, an electro-optical material is added to overlap the signal transmission layer for changing the characteristics of the transmitted optical signals, and therefore the overall performance of the package structure may be enhanced. The electro-optical material may be disposed in the interposer or the control unit and the computing units. As such, diverse design for the package structure may be adopted.

FIGS. 1A-1D are cross-sectional views illustrating various stages of forming a package structure 100 in accordance with some embodiments of the present disclosure. Referring to FIG. 1A, a substrate 50 is provided, and a plurality of through-substrate via (TSV) structures 51 may be formed in the substrate 50. In some embodiments, the substrate 50 may include a non-organic interposer material, for example, silicon-based dielectric materials such as silicon oxide, porous or non-porous organosilicate glass, silicon carbon nitride, silicon nitride, or any other non-organic interconnect-level dielectric material.

In some embodiments, more than one non-organic inter-poser material layer may be deposited by spin coating and drying of the respective non-organic dielectric material to form the substrate 50. For example, the substrate 50 may be formed in a series of steps such as by sequentially forming the TSV structures 51 at each layer of the substrate 50. The TSV structures 51 may be initially formed as via structures within the substrate 50 with a vertical dimension less than the thickness of the substrate 50. Subsequently, the back-side of the substrate 50 may be removed such that the "through-silicon" configuration for the substrate 50, as shown in FIG. 1D, for example.

In some embodiments, a hard mask layer (not shown, such as a silicon nitride layer and/or a borosilicate glass layer) and a patterned photoresist layer may be formed on and/or over a front-side surface of the substrate 50. An anisotropic etch that uses the hard mask (and optionally the patterned photoresist layer) as an etch mask may be per-formed to form the deep trenches that vertically extend from the front-side surface of the substrate 50 toward the backside of the substrate 50. The photoresist layer may be consumed during the anisotropic etch process, and the hard mask layer may be subsequently removed, for example, using a wet etch process. Accordingly, deep trenches may vertically extend from the front-side surface of the substrate 50 toward the backside surface of the substrate 50. Generally, the lateral dimension for the deep trenches may be selected to be large enough to provide deep etching into the substrate 50, and may be selected to be small enough to provide filling of the deep trenches for forming the TSV structures 51. At least one conductive material (such as a metallic material and/or a heavily-doped semiconductor material) may be deposited in the deep trenches and constitute the TSV structures 51. For example, the conductive material may include copper, nickel, or a stack of copper and nickel. Other suitable materials are within the contemplated scope of disclosure.

Figure 1B:
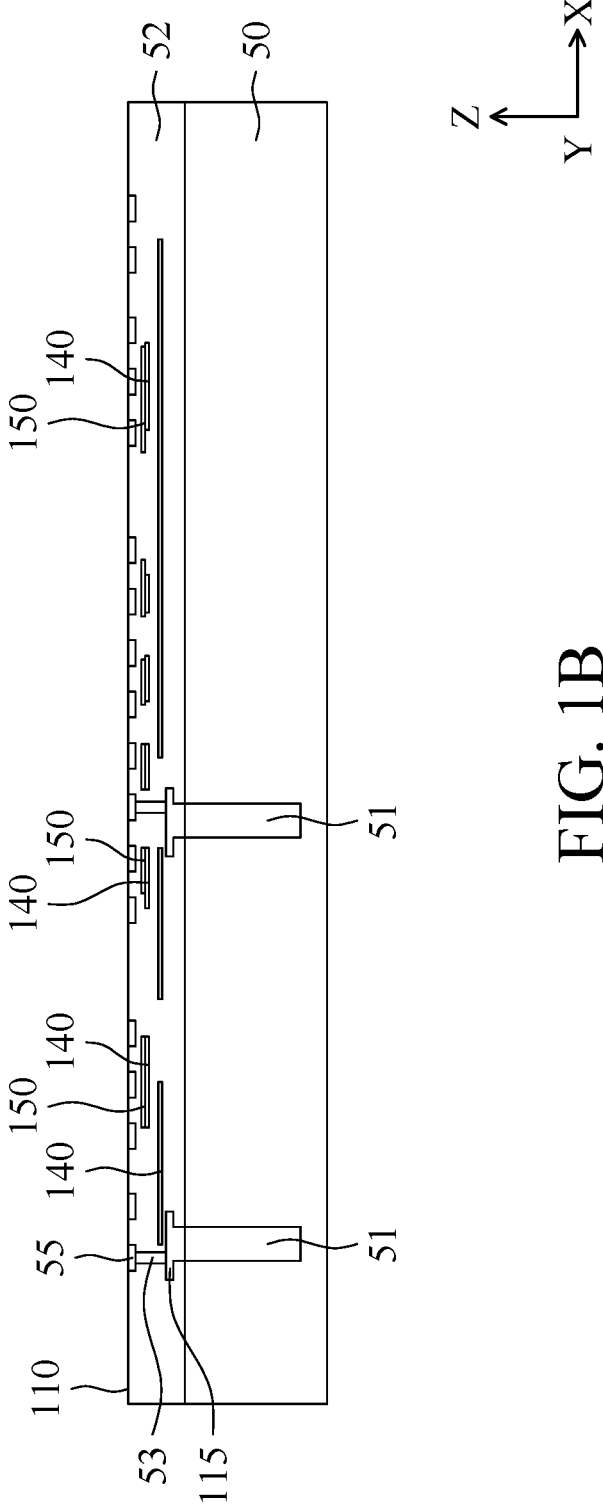

Referring to FIG. 1B, a base material 52 and conductive features 53 may be formed over the substrate 50. In some embodiments, a base material 52 may be deposited over exposed surfaces of the substrate 50 by a suitable deposition process such as CVD, PVD, ALD, HDPCVD, MOCVD, PECVD, sputtering, laser ablation, or the like. In some embodiment, the base material 52 may include an organic material, for example, a dielectric polymer material such as polyimide (PI), benzocyclobutene (BCB), or polybenzo-bisoxazole (PBO).

In some embodiment, the conductive features 53 may be formed in the base material 52 and include a conductive material (such as a metallic material and/or a heavily-doped semiconductor material). For example, the conductive mate-rial may include copper, nickel, or a stack of copper and nickel. However, other suitable materials are within the contemplated scope of disclosure. In some embodiments, the conductive features 53 may be formed using the method or material which is the same as that of the TSV structures 51.

In addition, a signal transmission layer 140 is formed in the base material 52, and an electro-optical material 150 is formed on the signal transmission layer 140. The signal transmission layer 140 may include nitride-based material, such as silicon nitride (SiN). The signal transmission layer 140 may be configured to transfer optical signals between the subsequently formed control unit 120 and computing units 130 (for example, shown in FIG. 1C). In some embodi-ments, the electric-optical material 150 overlaps the signal transmission layer 140 in a vertical direction, for example, parallel to the Z axis. For example, the electric-optical material 150 includes aluminum nitride, hexagonal boron nitride, graphene, or a combination thereof. The arrange-ment of the electric-optical material 150 may change the characteristics of the signal transmitted in the signal trans-mission layer 140, improving the operation quality or per-formance of the package structure 100. In the present embodiment, the signal transmission layer 140 is below and in contact with the electric-optical material 150, which indicates that signal transmission layer 140 is formed prior to the formation of the electric-optical material 150. How-ever, the present disclosure is not limited thereto. In some other embodiments, the signal transmission layer 140 is over and in contact with the electric-optical material 150.

The conductive pads 55 may be formed on the base material 52 and include a conductive material (such as a metallic material and/or a heavily-doped semiconductor material). For example, the conductive material may include copper, nickel, or a stack of copper and nickel. However, other suitable materials are within the contemplated scope of disclosure. In some embodiments, the conductive pads 55 may be formed using the method or material which is the same as that of the conductive features 53 or the TSV structures 51.

As set forth above, an interposer 110 is formed, and a redistribution structure 115 is formed in the interposer and constituted of the TSV structures 51, conductive features 53, and the conductive pads 55. It should be noted that the redistribution structure 115 is isolated from the signal trans-mission layer 140 and the electric-optical material 150. For the sake of brevity, some of the internal structure of the interposer 110 will not be labeled in the following drawings, and will not be discussed in detail as follows.

Figure 1C:
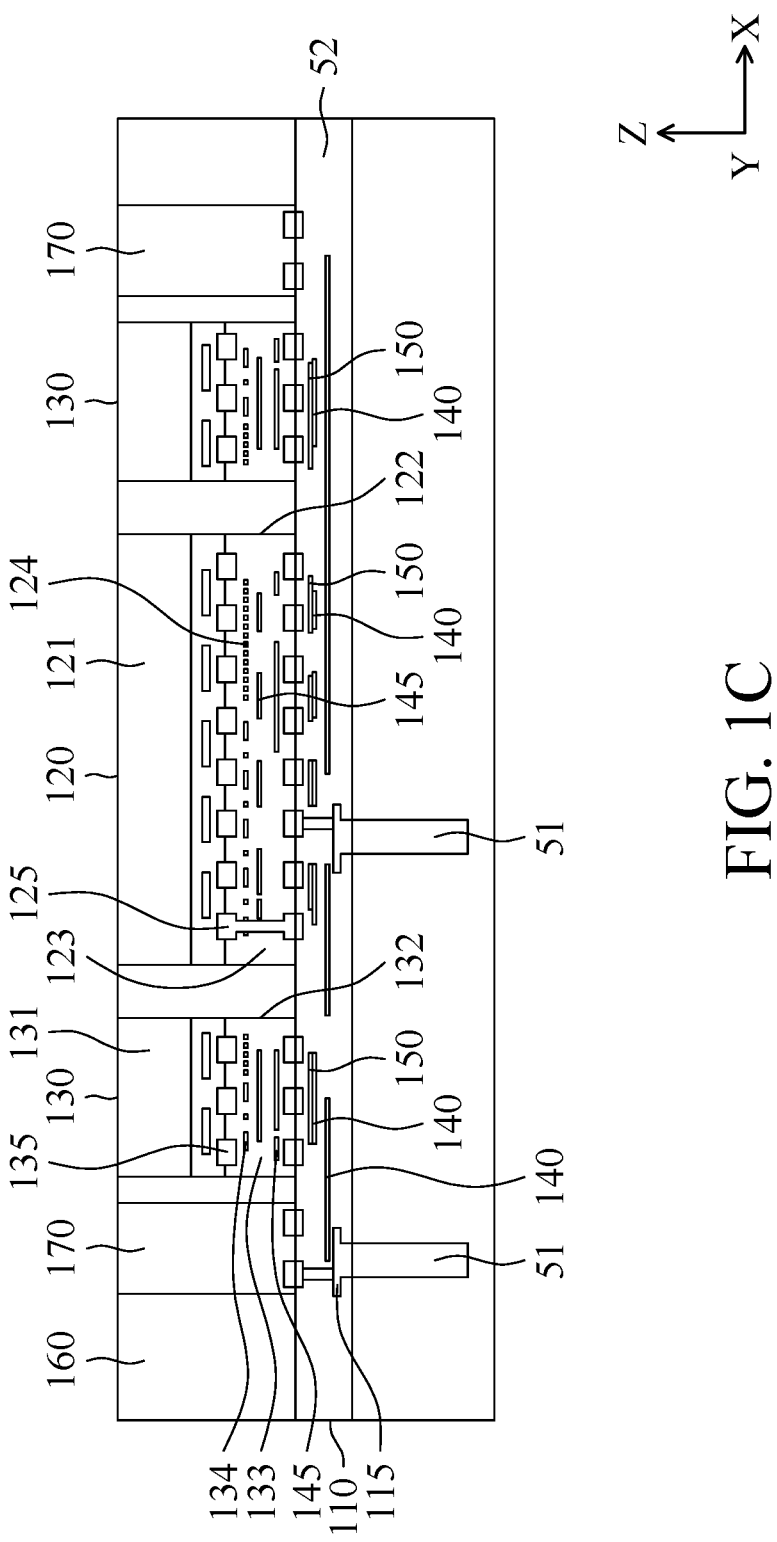
Figure 1D:
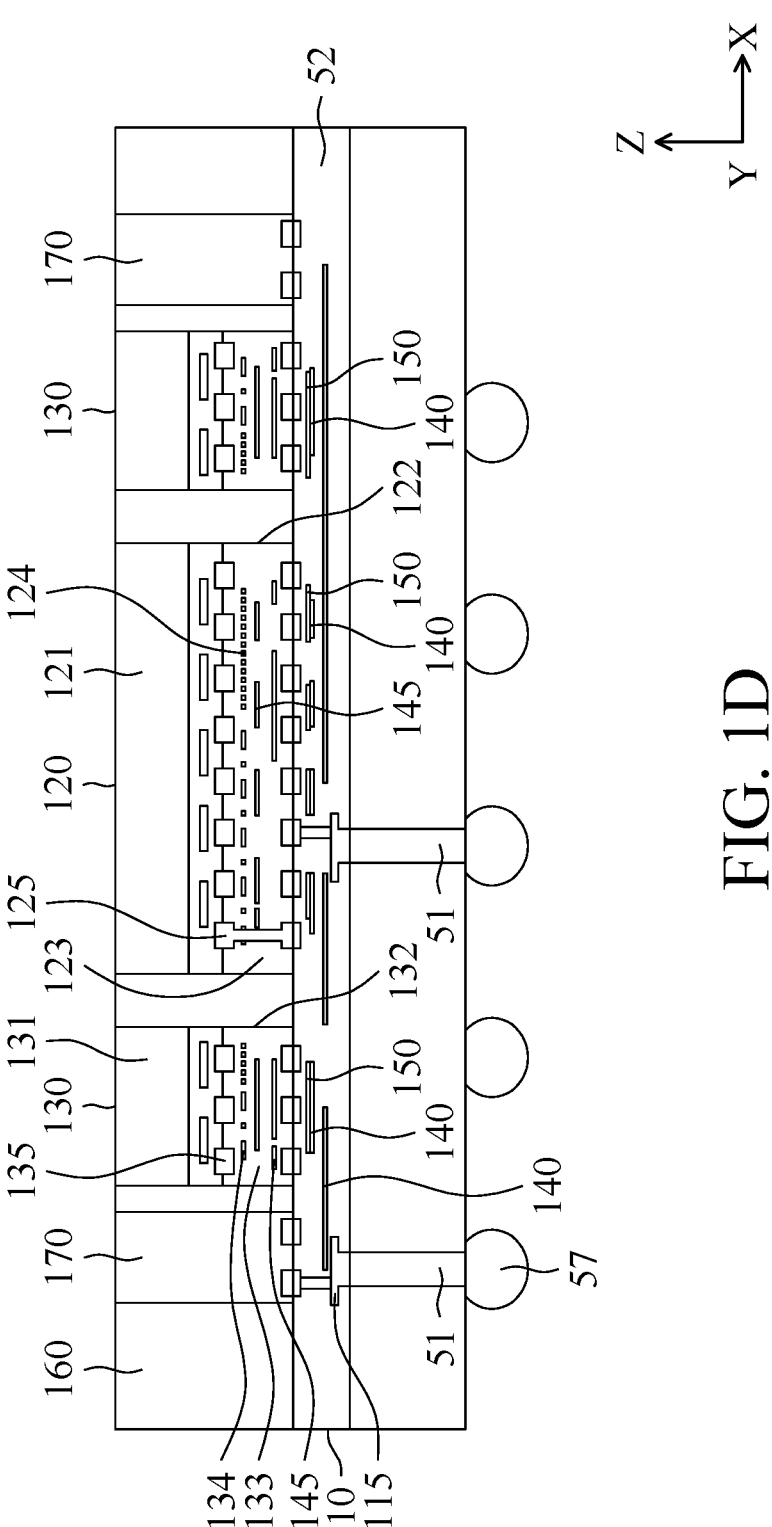

As shown in FIG. 1C, a control unit 120 and a plurality of computing units 130 are bonded to the interposer 110. More specifically, the control unit 120 and the computing units 130 are physical and electrically connected to the conductive pads 55. In some embodiment, the computing units 130 are disposed around and connected to the control unit 120. In some embodiments, the control unit 120 and the computing units 130 are aligned with a region where the signal transmission layer 140 and the electric-optical mate-rial 150 are located in the interposer 130. That is, the control unit 120 and the computing units 130 are overlapped with the signal transmission layer 140 and the electric-optical material 150 in the interposer 110, in the vertical direction, for example, parallel to the Z axis.

In some embodiment, the control unit 120 includes an integrated circuit 121 on an interconnect structure 122. The interconnect structure 122 includes a plurality of dielectric layers 123, multiple semiconductor devices 124 formed in the dielectric layers 123, and conductive features 125 elec-trically connected to the semiconductor devices 124. The conductive features 125 are aligned with and electrically connected to the conductive pads 55. In addition, at least one signal transmission layer 145 is formed in the interconnect structure 122. The signal transmission layer 145 may include nitride-based material, such as silicon nitride (SiN). The signal transmission layer 145 may be configured to transfer optical signals to the control unit 120. In some embodi-ments, the signal transmission layer 145 may be formed using the method or material the same as that of signal transmission layer 140.

Similarly, the computing units 130 each include an inte-grated circuit 131 on an interconnect structure 132. The interconnect structure 132 includes a plurality of dielectric layers 133, multiple semiconductor devices 134 formed in the dielectric layers 133, and conductive features 135 elec-trically connected to the semiconductor devices 134. The conductive features 135 are aligned with and electrically connected to the corresponding conductive pads 55. In addition, at least one signal transmission layer 145 is formed in the interconnect structure 132, and configured to transfer optical signals to the computing units 130.

In addition, a plurality of signal sources 170 are also bonded to the interposer 110, wherein the signal source 170 are connected to either the control unit 120 or the computing units 130 via the signal transmission layer 140, respectively. In some embodiments, the signal sources 170 are configured to receive electric signals and convert the received electric signals to optical signals, which are transmitted to the control unit 120 or the computing units 130 via the signal transmission layer 140. As a result, the control unit 120 and the computing units 130 may operate based on the transmitted optical signals to execute the instructions.

After the control unit 120, the computing units 130 and the signal sources 170 are each positioned on the interposer 110, an underfill 160 may be dispensed over the interposer 110 for packaging the control unit 120, the computing units 130 and the signal sources 170. In some embodiments, the computing units 130 are spaced apart from the control unit 120 by the underfill 160. In some embodiments, the underfill 160 may be formed over the top surfaces of the control unit 120, the computing units 130 and the signal sources 170. Then, the portions of the underfill 160 higher than the control unit 120, the computing units 130 and the signal sources 170 (for example, directly over the top surfaces of the control unit 120, the computing units 130 and the signal sources 170) may be removed by a suitable planarization process, such as chemical mechanical polishing (CMP). Therefore, the top surface of the underfill 160 is substantially coplanar with the top surfaces of the control unit 120, the computing units 130 and the signal sources 170.

As shown in FIG. 1D, the interposer 110 is thinned down and the TSV structure 51 are exposed on the back-side of the interposer 110. In some embodiments, the bump structures 57 may be conductive ball structures (such as ball grid array (BGA)), conductive pillar structures, or conductive paste structures that are mounted on and electrically coupled to the interposer 110 in the bonding process. In embodiments in which the interposer 110 includes C4 bonding pads, the bump structures 57 may be C4 solder balls, i.e., solder material portions in the shapes of balls that may be used for C4 bonding. In embodiments in which the interposer 110 includes an array of microbumps for C2 bonding, the bump structures 57 may be solder caps that wet the entirety of a planar end surface of the respective microbump and have generally hemispherical shapes. While the present disclosure is described using an embodiment in which the bump structures 57 are represented by spherical C4 solder balls, embodiments are expressly contemplated herein in which the bump structures 57 are solder caps having hemispherical shapes.

Figure 2:
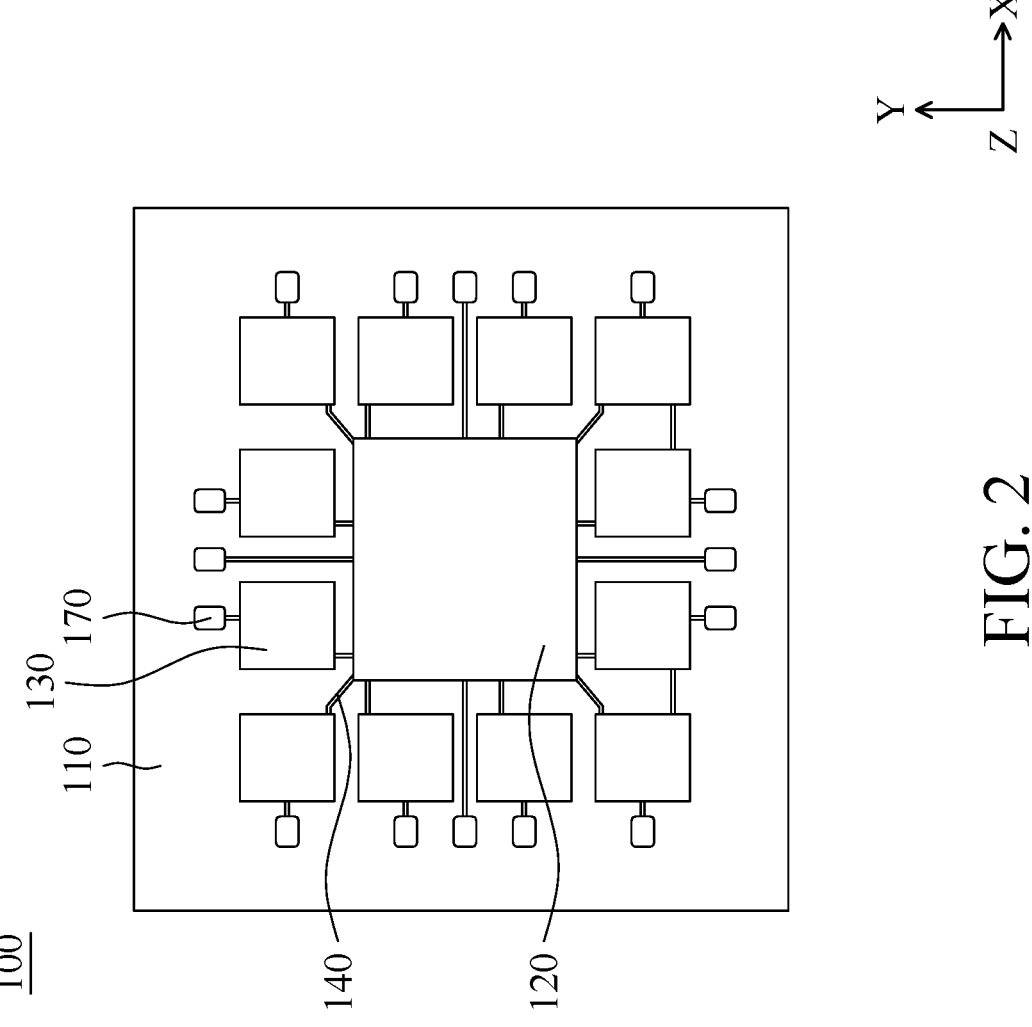
FIG. 2 is a top view illustrating the package structure in accordance with some embodiments of the present disclosure.

FIG. 2 is a top view illustrating the package structure 100 in accordance with some embodiments of the present disclosure. As shown in FIG. 2, the computing units 130 are located on each side of the control unit 120. That is, the control unit 120 is surrounded by the computing units 130. However, the present disclosure is not limited thereto. In some embodiments, the computing units 130 are linearly arranged along an edge of the control unit 120. Since the control unit 120 is located at the center of the computing units 130, the connection (such as the signal transmission layer 140 connected to the control unit 120 and the computing units 130) between the control unit 120 and the computing units 130 may be shortened. Therefore, the manufacturing cost may be reduced, and the overall performance of the package structure 100 may be enhanced.

Figure 3:
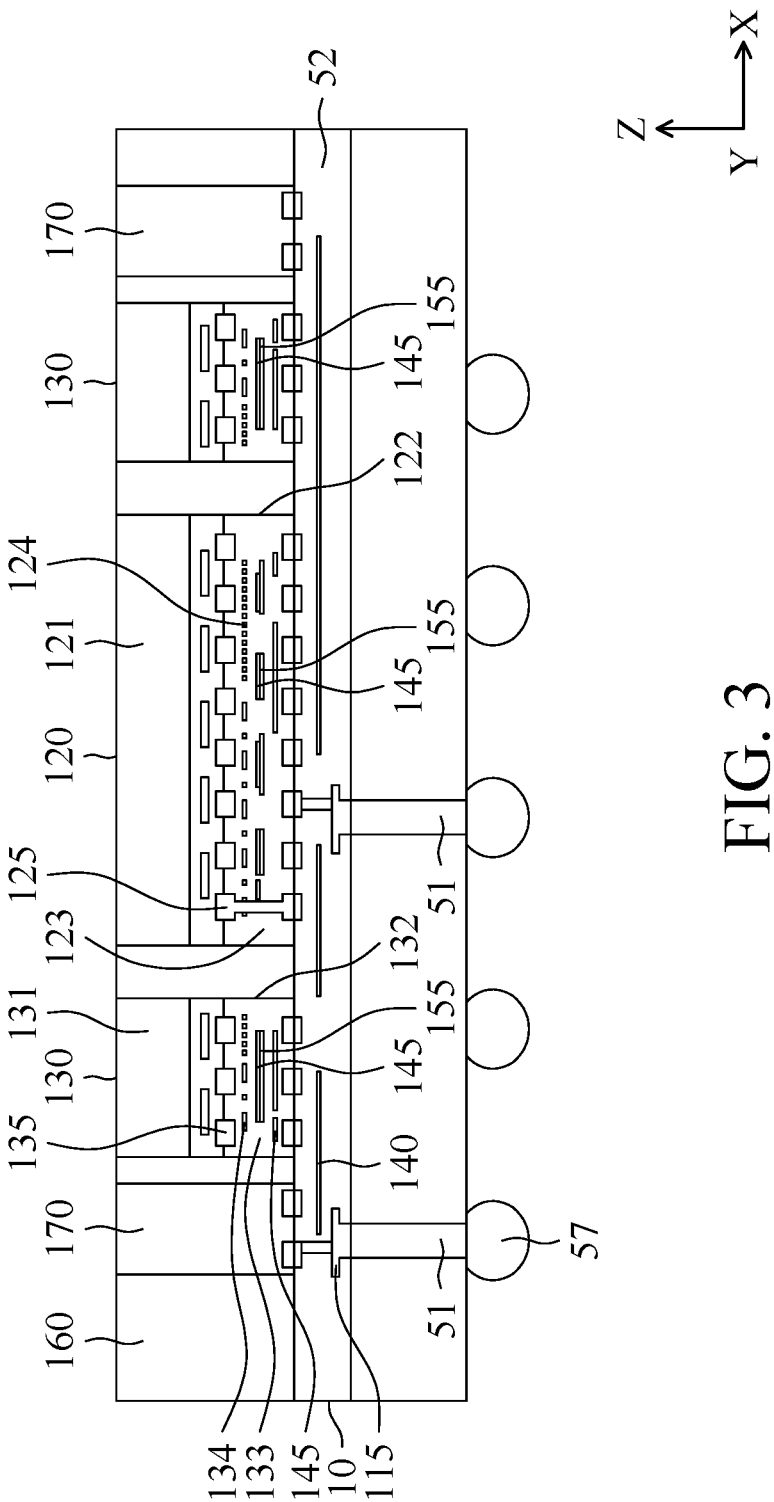
FIG. 3 is a cross-sectional view illustrating the package structure in accordance with some embodiments of the present disclosure.

FIG. 3 is a cross-sectional view illustrating the package structure 200 in accordance with some embodiments of the present disclosure. It should be noted that the package structure 200 in the present embodiment may include elements that are the same or similar to the package structure 100 shown in FIG. 1D. These elements will be denoted by the same or similar numerals and will not be discussed in detail in the following paragraphs. As shown in FIG. 3, the package structure 200 includes an interposer 110, a control unit 120 and a plurality of computing units 130. The control unit 120 and the computing units 130 are bonded to the interposer 110. A signal transmission layer 140 is formed in the interposer 110. In the present embodiment, a signal transmission layer 145 is formed in the control unit 120 and the computing units 130, and an electric-optical material 155 is formed in the control unit 120 and the computing units 130. In some embodiments, the electric-optical material 155 overlaps the signal transmission layer 145. The electric-optical material 155 changes the characteristics of the signal transmitted in the signal transmission layer 145, improving the operation quality or performance of the package structure 200.

Figure 4A:
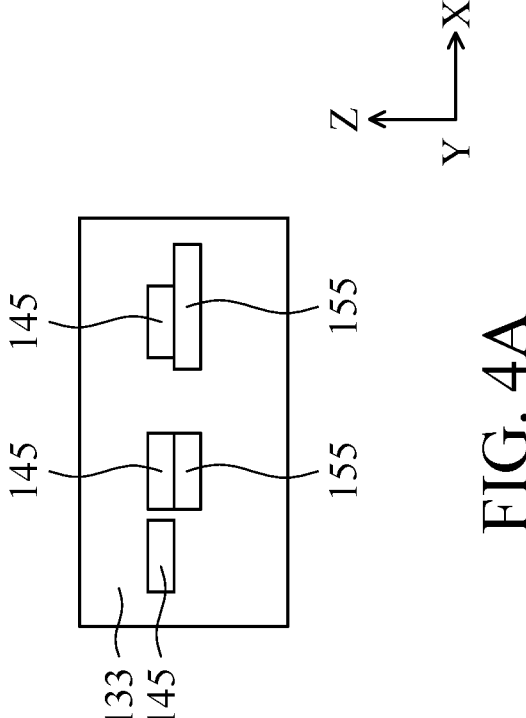
FIG. 4A is a cross-sectional view illustrating the signal transmission layer and the electro-optical material in the computing unit in accordance with some embodiments of the present disclosure.

FIG. 4A is a cross-sectional view illustrating the signal transmission layer 145 and the electro-optical material 155 in the computing unit 130 in accordance with some embodiments of the present disclosure. As shown in FIG. 4A, the width of the electric-optical material 155 may be different from the width of the signal transmission layer 145. For example, the width of the electric-optical material 155 is longer than the width of the signal transmission layer 145. However, the present disclosure is not limited thereto. In some embodiments, the width of the electric-optical material 155 may be less than or equal to the width of the signal transmission layer 145. In some embodiments, a sidewall of the electric-optical material 155 is vertically aligned with a sidewall of the signal transmission layer 145.

Figure 4B:
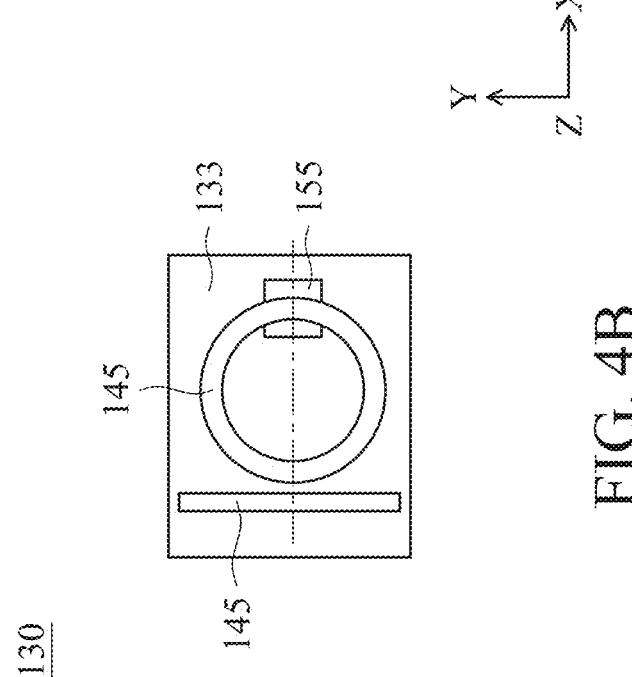
FIG. 4B is a top view illustrating the signal transmission layer and the electro-optical material in the computing unit in accordance with some embodiments of the present disclosure.

FIG. 4B is a top view illustrating the signal transmission layer 145 and the electro-optical material 155 in the computing unit 130 in accordance with some embodiments of the present disclosure. As shown in FIG. 4B, a portion of the signal transmission layer 145 has a ring shape, and the electro-optical material 155 has a rectangular shape. In some embodiments, the signal transmission layer 145 and/or the electro-optical material 155 may be elongated, circular, rectangular, with or without rounded corners. The signal transmission layer 145 overlaps the electro-optical material 155 in the top view. For example, the area of the signal transmission layer 145 may be no more than 5% overlapped with the area of the electro-optical material 155. In some embodiments, the shapes of the signal transmission layer 145 and the electro-optical material 155 may be similar or the same.

Figure 5:
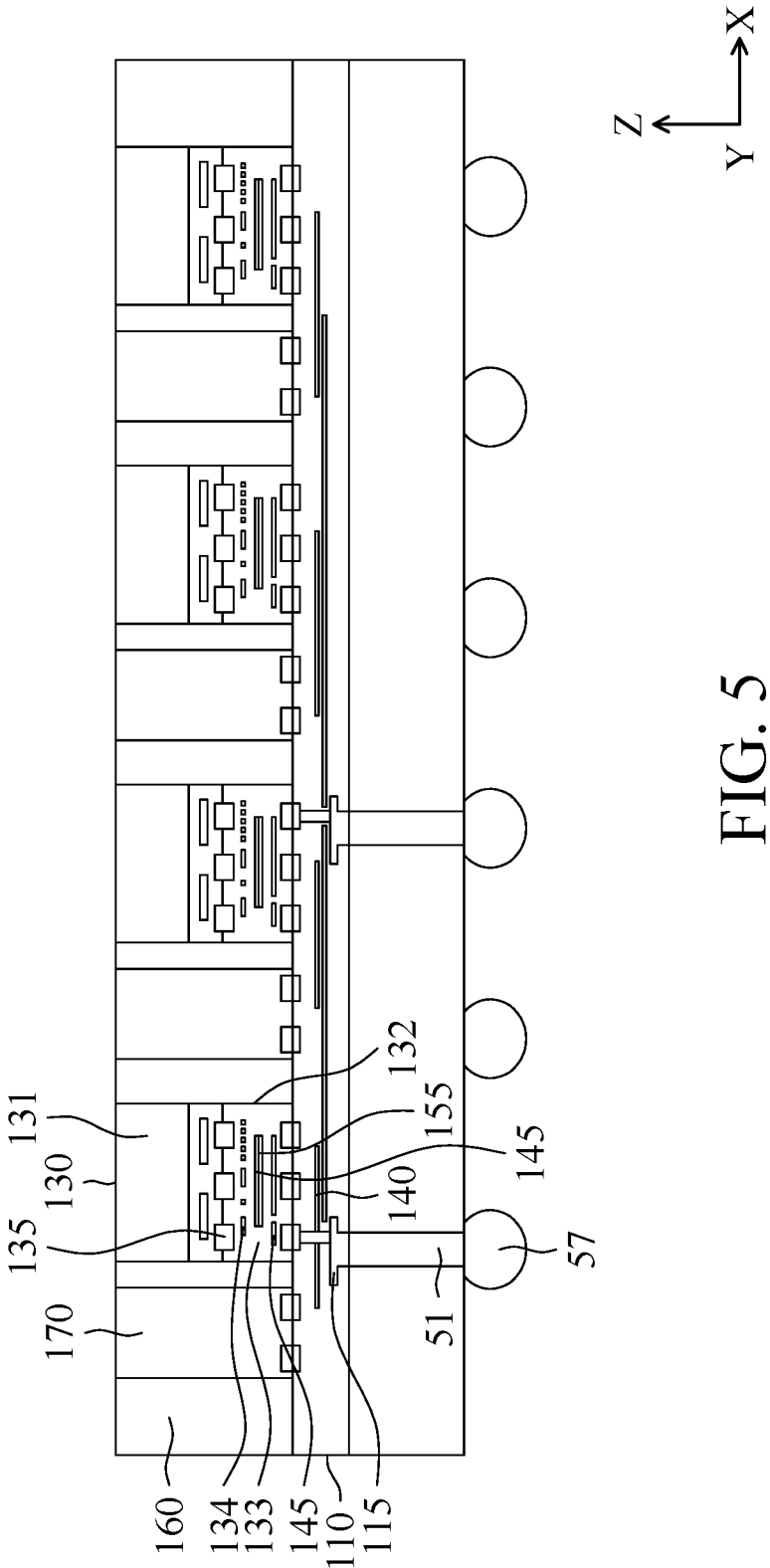
FIG. 5 is a cross-sectional view illustrating the package structure in accordance with some embodiments of the present disclosure.
Figure 6:
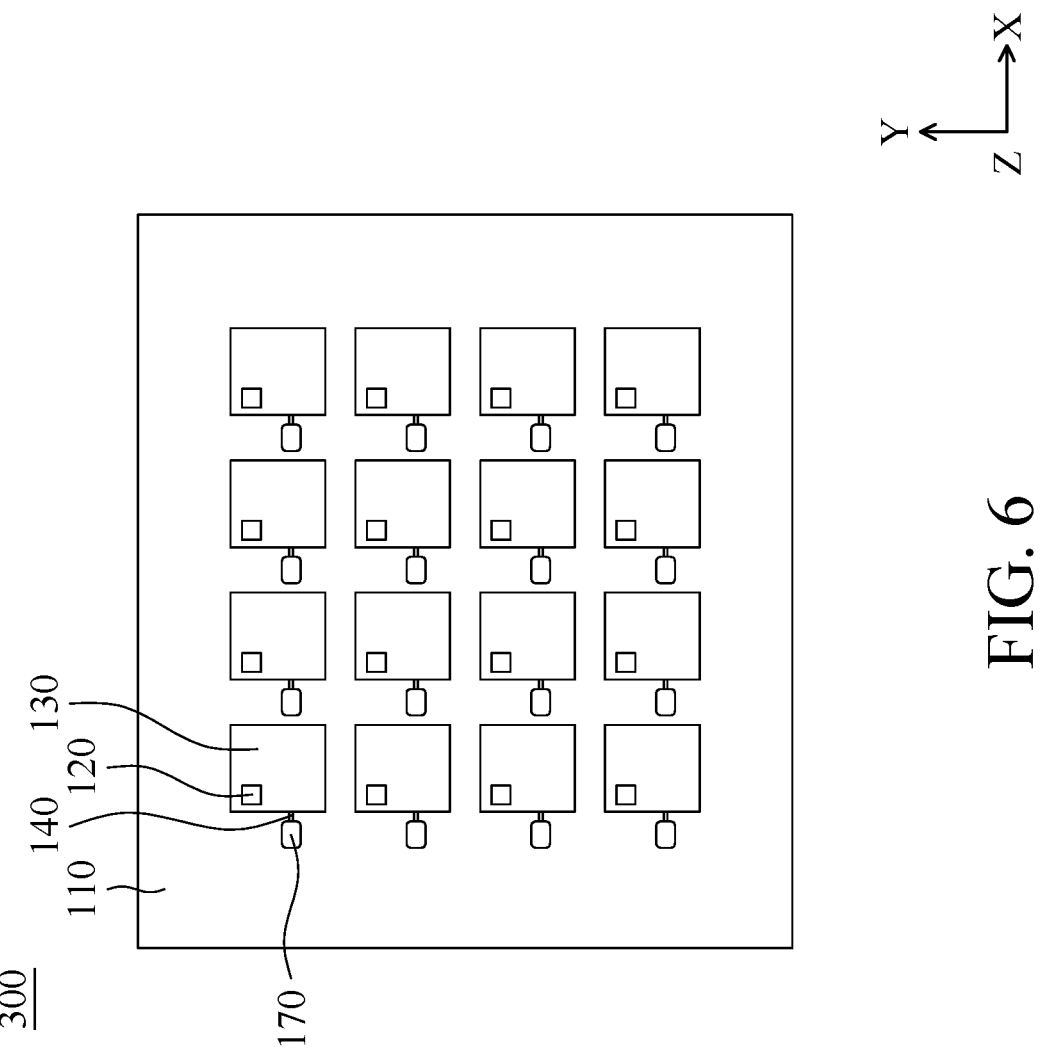
FIG. 6 is a top view illustrating the package structure in accordance with some embodiments of the present disclosure.

FIG. 5 is a cross-sectional view illustrating the package structure 300 in accordance with some embodiments of the present disclosure. FIG. 6 is a top view illustrating the package structure 300 in accordance with some embodiments of the present disclosure. It should be noted that the package structure 300 in the present embodiment may include elements that are the same or similar to the package structure 200 shown in FIG. 3. These elements will be denoted by the same or similar numerals and will not be discussed in detail in the following paragraphs. As shown in FIG. 5, the package structure 300 includes an interposer 110, a plurality of control units 120, a plurality of computing units 130, and a plurality of signal sources 170. The control units 120 are each integrated with the computing units 130, and the signal sources 170 are each bonded adjacent to the computing units 130. In the present embodiment, a signal transmission layer 140 is formed in the interposer 110, a signal transmission layer 145 is formed in the control unit 120 and the computing units 130, and an electric-optical material 155 is formed in the control unit 120 and the computing units 130. Since the control units 120 are each integrated with the computing units 130, the flexibility of the arrangement of the control units 120 and the computing units 130 may be increased.

As shown in FIG. 6, the computing units 130 are arranged as an array over the interposer 110, and a control unit 120 is located in the corresponding computing unit 130. As a result, the density of the computing units 130 per unit area may be increased, thereby reducing the area occupied by the control units 120 and the computing units 130 to achieve miniaturization of the package structure 300. The signal sources 170 are each disposed adjacent to and connected to the computing units 130 via the signal transmission layer 140. In some embodiments, the signal source 170 is disposed between the adjacent computing units 130.

Figure 7:
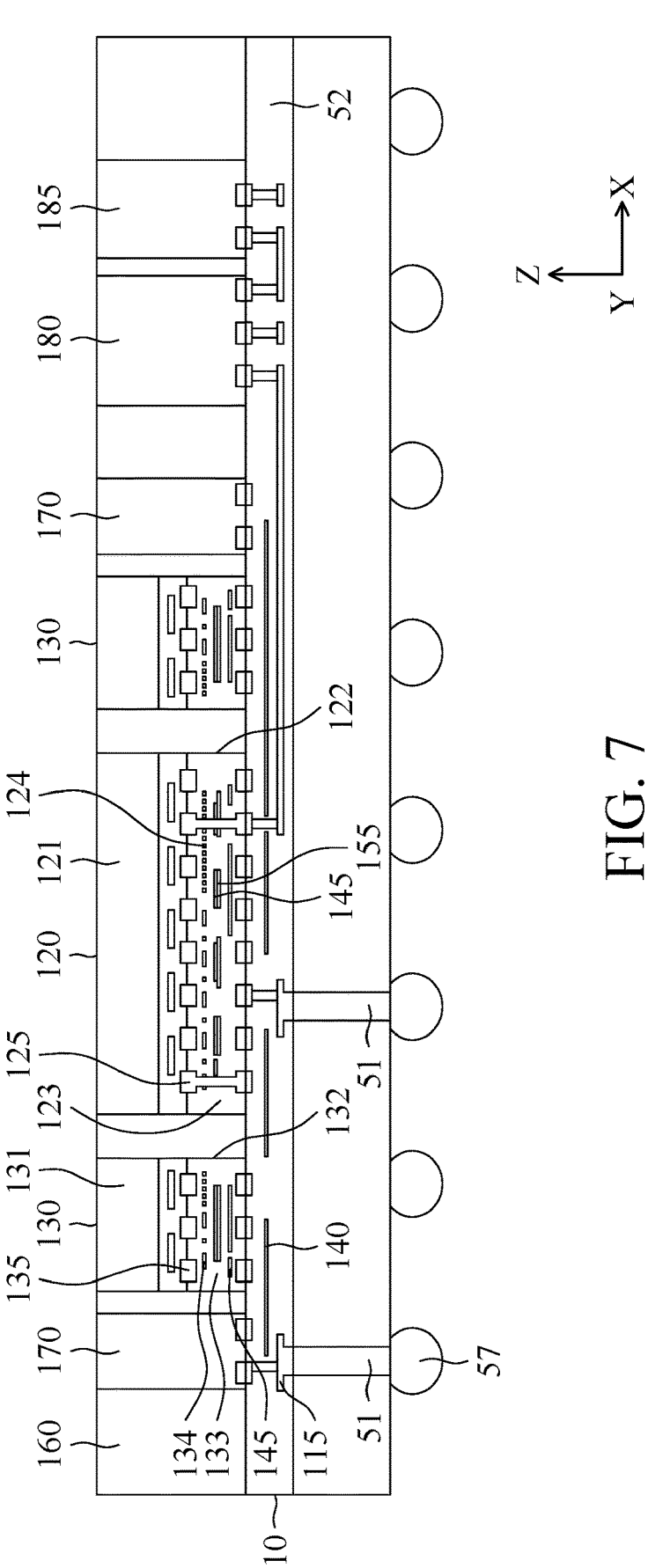
FIG. 7 is a cross-sectional view illustrating the package structure in accordance with some embodiments of the present disclosure.
Figure 8:
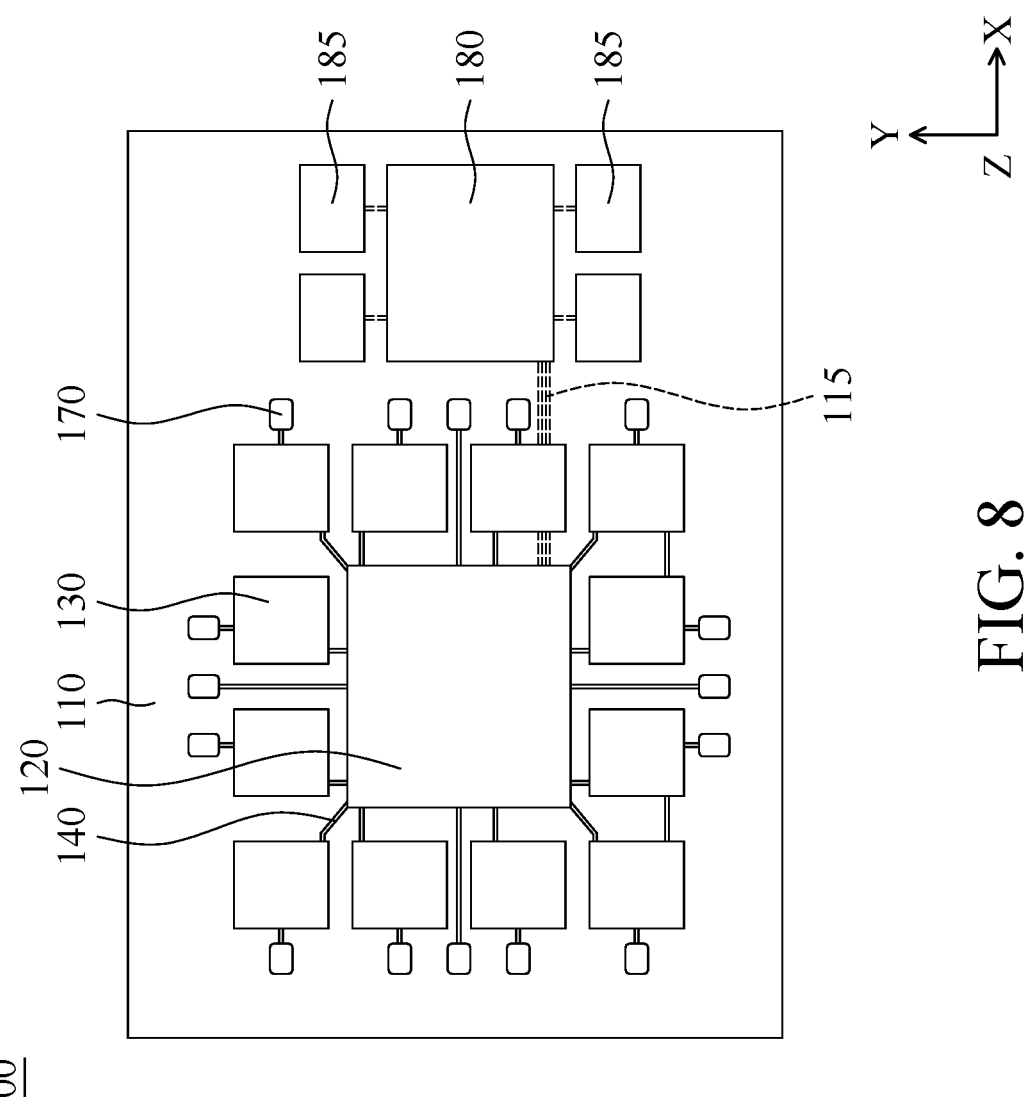
FIG. 8 is a top view illustrating the package structure in accordance with some embodiments of the present disclosure.

FIG. 7 is a cross-sectional view illustrating the package structure 400 in accordance with some embodiments of the present disclosure. FIG. 8 is a top view illustrating the package structure 400 in accordance with some embodiments of the present disclosure. It should be noted that the package structure 400 in the present embodiment may include elements that are the same or similar to the package structure 200 shown in FIG. 3. These elements will be denoted by the same or similar numerals and will not be discussed in detail in the following paragraphs. As shown in FIG. 7, the package structure 400 includes an interposer 110, a control unit 120 and a plurality of computing units 130. The control unit 120 and the computing units 130 are bonded to the interposer 110. A signal transmission layer 140 is formed in the interposer 110. In the present embodiment, a signal transmission layer 145 is formed in the control unit 120 and the computing units 130, and an electric-optical material 155 is formed in the control unit 120 and the computing units 130.

In the present embodiments, a processor 180 and a plurality of memory device 185 are bonded to the interposer, and the memory device 185 are located adjacent to the processor 180. In some embodiments, the processor 180 and the memory device 185 are connected to the control unit 120 via the redistribution structure 115 in the interposer 110. In some embodiments, the processer 180 may include a central processing unit, a graphics processing unit, a microprocessor, a controller, a microcontroller, a digital signal processor, a field-programmable gate array, an application-specific integrated circuit, and/or another type of processing component. The processor 180 is implemented in hardware, firmware, or a combination of hardware and software. In some implementations, the processor 180 includes one or more processors capable of being programmed to perform one or more operations or processes described elsewhere herein.

In some embodiments, the memory devices 185 each include a vertical stack of static random access memory dies and provide high bandwidth as defined under JEDEC standards, i.e., standards defined by The JEDEC Solid State Technology Association. Accordingly, the memory devices 185 may be referred to as high bandwidth memory, and store information, instructions, and/or software (e.g., one or more software applications) related to the operation of package structure 400.

8

Figure 9:
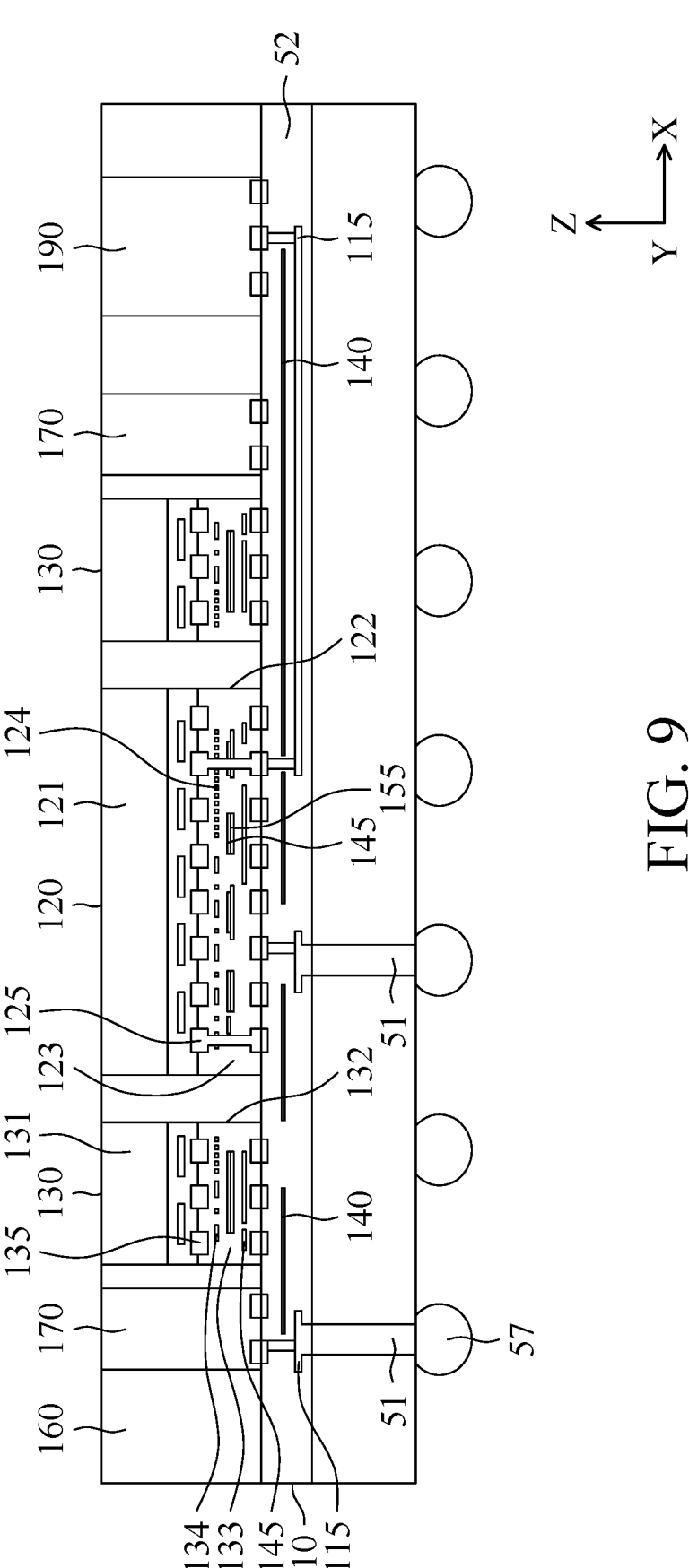
FIG. 9 is a cross-sectional view illustrating the package structure in accordance with some embodiments of the present disclosure.
Figure 10:
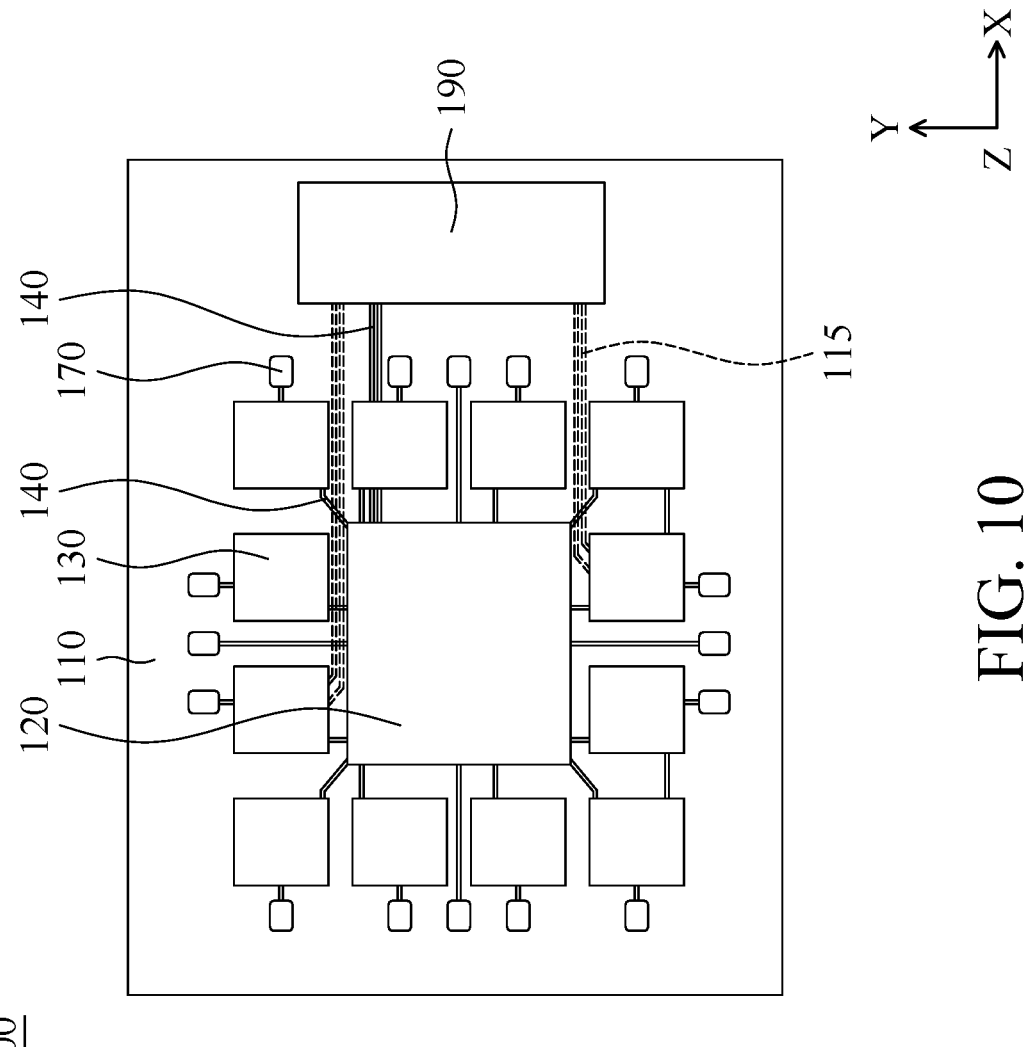
FIG. 10 is a top view illustrating the package structure in accordance with some embodiments of the present disclosure.

FIG. 9 is a cross-sectional view illustrating the package structure 500 in accordance with some embodiments of the present disclosure. FIG. 10 is a top view illustrating the package structure 500 in accordance with some embodiments of the present disclosure. It should be noted that the package structure 500 in the present embodiment may include elements that are the same or similar to the package structure 200 shown in FIG. 3. These elements will be denoted by the same or similar numerals and will not be discussed in detail in the following paragraphs. As shown in FIG. 9 and FIG. 10, the package structure 500 includes an interposer 110, a control unit 120 and a plurality of computing units 130. The control unit 120 and the computing units 130 are bonded to the interposer 110. A signal transmission layer 140 is formed in the interposer 110. In the present embodiment, a signal transmission layer 145 is formed in the control unit 120 and the computing units 130, and an electric-optical material 155 is formed in the control unit 120 and the computing units 130.

In some embodiments, an optical element 190 is bonded to the interposer and connected to the control unit 120 and the computing units 130 via the signal transmission layer 140 and the redistribution structure 115. The optical element 190 may receive optical signals (for example, light) and transfer the received optical signals to electric signals, which are transmitted to the control unit 120 or the computing units 130 via the signal transmission layer 140 and the redistribution structure 115. As a result, the control unit 120 and the computing units 130 may operate based on the transmitted electric signals to execute the instructions.

Figure 11:
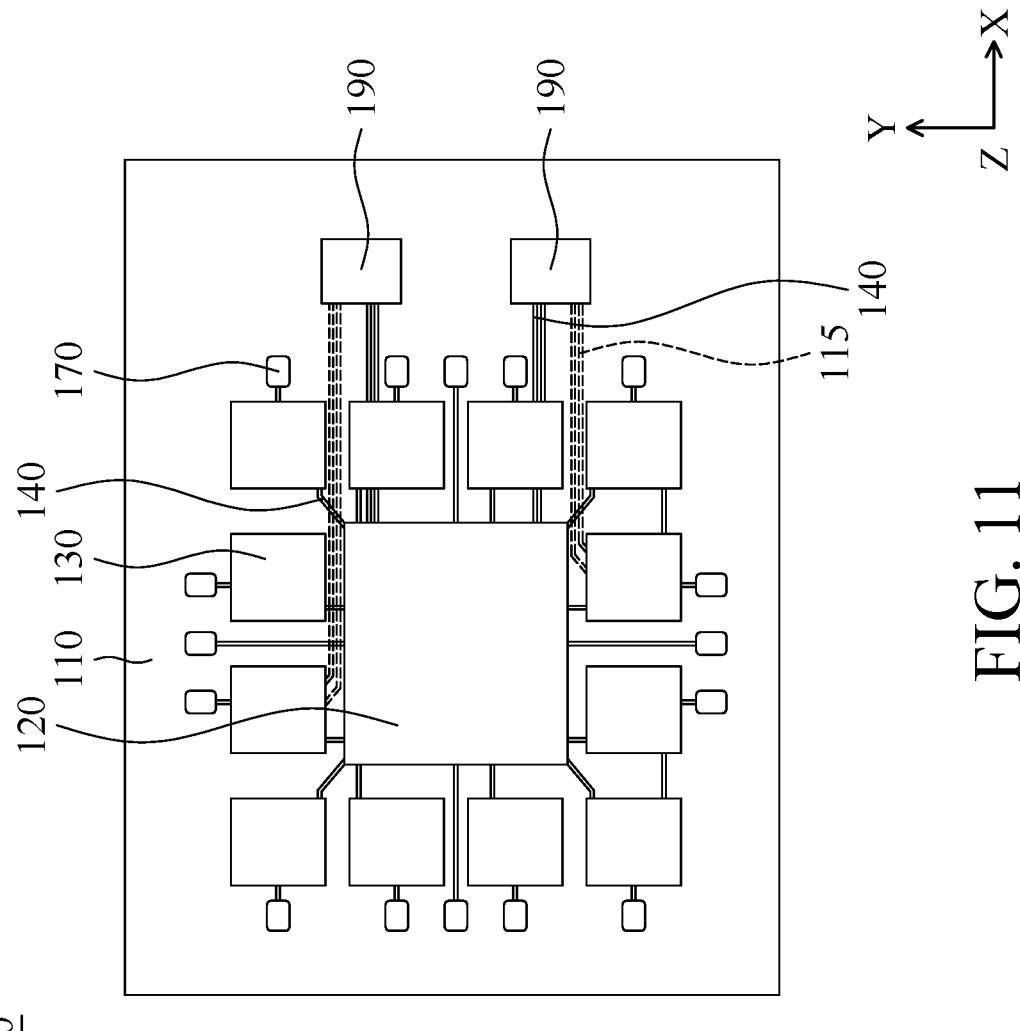
FIG. 11 is a top view illustrating the package structure in accordance with some embodiments of the present disclosure.

FIG. 11 is a top view illustrating the package structure 600 in accordance with some embodiments of the present disclosure. It should be noted that the package structure 600 in the present embodiment may include elements that are the same or similar to the package structure 500 shown in FIG. 10. These elements will be denoted by the same or similar numerals and will not be discussed in detail in the following paragraphs. As shown in FIG. 11, the package structure 600 includes an interposer 110, a control unit 120 and a plurality of computing units 130. The control unit 120 and the computing units 130 are bonded to the interposer 110. In some embodiments, a plurality of optical elements 190 are bonded to the interposer 110 and connected to the control unit 120 and the computing units 130 via the signal transmission layer 140 and the redistribution structure 115. The arrangement of multiple optical elements 190 may increase the flexibility of design the package structure 600 since separated optical elements 190 may occupy less area than single optical element 190. In some embodiments, the optical elements 190 are located on single side of the interposer 110. However, the present disclosure is not limited thereto. In some other embodiments, the optical elements 190 are located on different sides or corners of the interposer 110.

Figure 12:
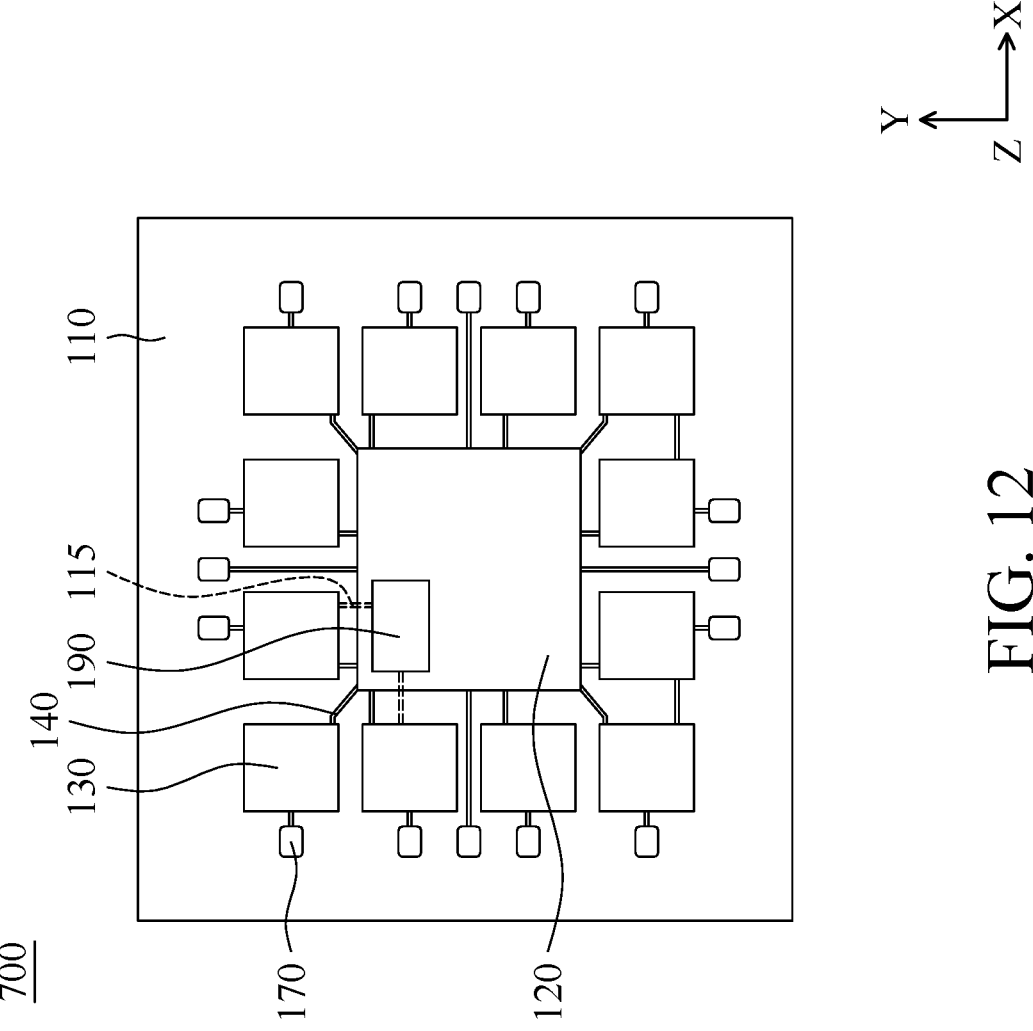
FIG. 12 is a top view illustrating the package structure in accordance with some embodiments of the present disclosure.

FIG. 12 is a top view illustrating the package structure 700 in accordance with some embodiments of the present disclosure. It should be noted that the package structure 700 in the present embodiment may include elements that are the same or similar to the package structure 500 shown in FIG. 10. These elements will be denoted by the same or similar numerals and will not be discussed in detail in the following paragraphs. As shown in FIG. 12, the package structure 700 includes an interposer 110, a control unit 120 and a plurality of computing units 130. The control unit 120 and the computing units 130 are bonded to the interposer 110. In some embodiments, an optical element 190 is disposed in and integrated with the control unit 120 and connected to the computing units 130 via the signal transmission layer 140. Accordingly, the connection (such as the signal transmission layer 140 connected to the optical element 190 and the computing units 130) between the optical element 190 and the computing units 130 may be shortened, and the signal transmission layer 140 connected to the optical element 190 and the control unit 120 may be omitted. Therefore, the manufacturing cost may be reduced, and the overall performance of the package structure 700 may be enhanced.

Figure 13:
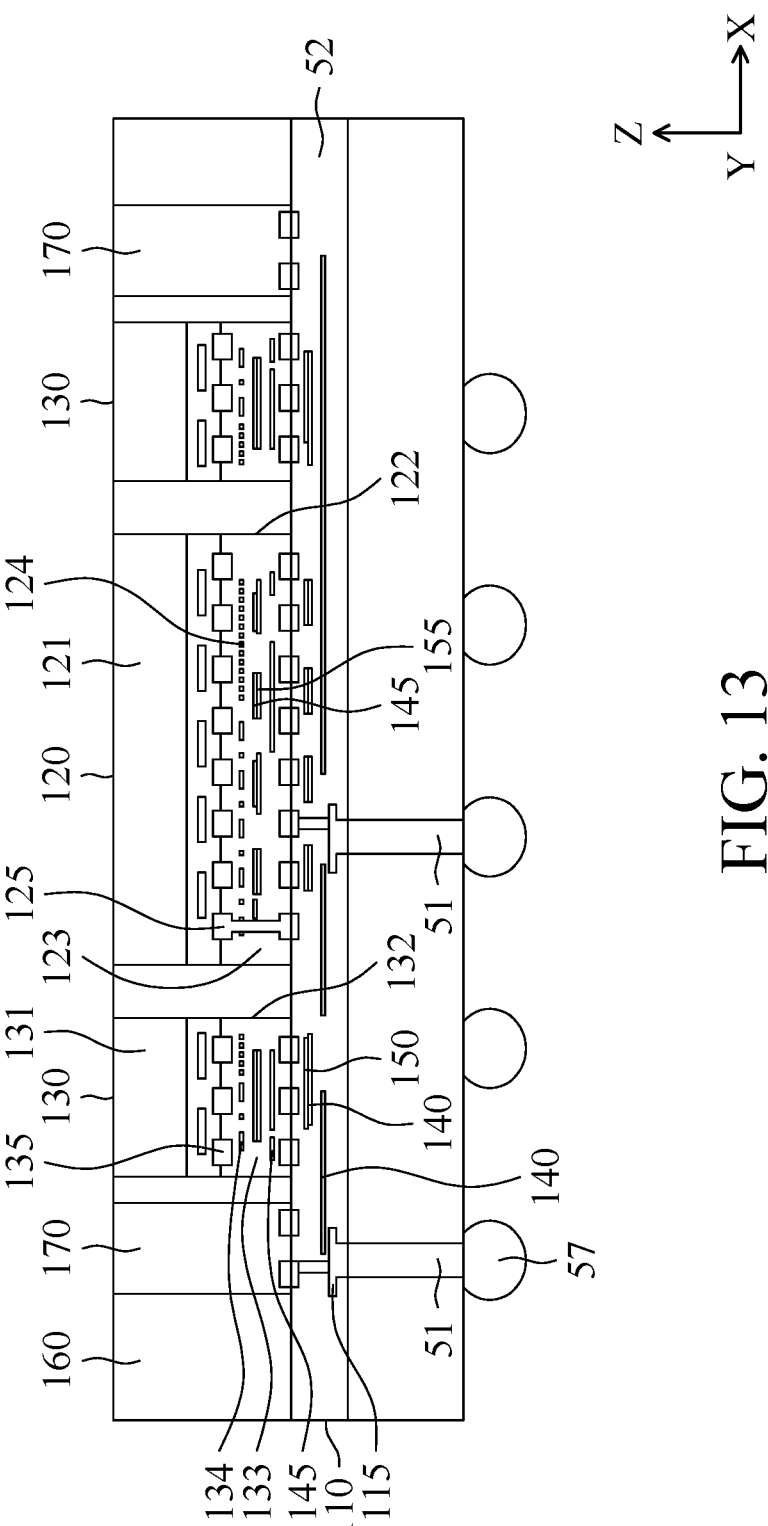
FIG. 13 is a cross-sectional view illustrating the package structure in accordance with some embodiments of the present disclosure.

FIG. 13 is a cross-sectional view illustrating the package structure 800 in accordance with some embodiments of the present disclosure. It should be noted that the package structure 800 in the present embodiment may include elements that are the same or similar to the package structure 100 shown in FIG. 1D. These elements will be denoted by the same or similar numerals and will not be discussed in detail in the following paragraphs. As shown in FIG. 13, the package structure 800 includes an interposer 110, a control unit 120 and a plurality of computing units 130. The control unit 120 and the computing units 130 are bonded to the interposer 110. A signal transmission layer 140 and an electric-optical material are formed in the interposer 110. In addition, a signal transmission layer 145 is formed in the control unit 120 and the computing units 130, and an electric-optical material 155 is formed in the control unit 120 and the computing units 130. With the arrangement of the multiple electric-optical materials 150 and 155, the design flexibility may be enhanced for the package structure 800. For example, the control unit 120 and the computing units 130 without the electric-optical material 155 may also be bonded with the control unit 120 and the computing units 130 with the electric-optical material 155 on the same interposer.

As described above, the present disclosure is directed to package structures and methods for forming the same. The package structure includes a control unit and a plurality of computing units surrounding the control unit. Accordingly, the connection between the control unit and each computing unit may be shortened, reducing the manufacturing cost. In addition, an electro-optical material is added to overlap the signal transmission layer for changing the characteristics of the transmitted optical signals, and therefore the overall performance of the package structure may be enhanced. The electro-optical material may be disposed in the interposer or the control unit and the computing units, and therefore diverse design for the package structure may be adopted. Furthermore, signal sources, processers, memory devices, and the optical elements may also be boned to the interposer with the control unit and the computing unit for performing more functions.

In accordance with some embodiments, a package structure includes an interposer, a control unit, a plurality of computing units, a signal transmission layer, and an electric-optical material. The control unit is bonded to the interposer. The computing units are disposed around and connected to the control unit. The signal transmission layer is formed in the control unit and the computing units. The electric-optical material is formed in the control unit and the computing units, and the electric-optical material overlaps the signal transmission layer.

In accordance with some embodiments, a package structure, includes an interposer, a signal transmission layer formed in the interposer, an electric-optical material formed in the interposer, a control unit bonded to the interposer, and a plurality of computing units. The electric-optical material overlaps the signal transmission layer. The computing units are bonded to the interposer and connected to the control unit via the signal transmission layer.

In accordance with some embodiments, a method of forming a package structure includes forming a plurality of through-substrate via (TSV) structures in a substrate forming a base material over the substrate. The method includes forming a plurality of conductive features in the base material. The conductive features are electrically connected to the TSV structures. The method includes forming a signal transmission layer in the base material. The signal transmission layer is isolated from the conductive features. The method includes forming an electric-optical material in the base material. The electric-optical material overlaps the signal transmission layer. The method includes bonding a control unit and a plurality of computing units to the interposer. The computing units are spaced apart from the control unit, and the computing units are connected to the control unit by the signal transmission layer. The method includes filling an underfill in a gap between the control unit and the computing units.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a package structure, comprising:
   forming an interposer, comprising:
   forming a plurality of through-substrate via (TSV) structures in a substrate;
   forming a base material over the substrate;
   forming a plurality of conductive features in the base material, wherein the conductive features are electrically connected to the TSV structures;
   forming a signal transmission layer in the base material, wherein the signal transmission layer is isolated from the conductive features; and
   forming an electric-optical material in the base material, wherein the electric-optical material overlaps the signal transmission layer;
   bonding a control unit and a plurality of computing units to the interposer, wherein the computing units are spaced apart from the control unit, and the computing units are connected to the control unit by the signal transmission layer; and
   filling an underfill in a gap between the control unit and the computing units.

2. The method as claimed in claim 1, further comprising:
   bonding a signal source to the interposer, wherein the signal source is adjacent to the computing units and surrounded by the underfill.

3. The method as claimed in claim 1, wherein forming the electric-optical material in the interposer further comprises forming the electric-optical material in contact with the signal transmission layer.

4. The method as claimed in claim 1, wherein bonding the control unit and the computing units to the interposer further comprises aligning the control unit and the computing units with a region where the signal transmission layer and the electric-optical material are located in the interposer.

5. The method as claimed in claim 1, wherein the computing units are arranged on each side of the control unit.

6. The method as claimed in claim 1, wherein a width of the electric-optical material is different from a width of the signal transmission layer.

7. The method as claimed in claim 1, wherein the electric-optical material comprises aluminum nitride, hexagonal boron nitride, graphene, or a combination thereof.

8. A method of forming a package structure, comprising:
  forming a first signal transmission layer in a base material;
  forming a first electric-optical material on the signal transmission layer, wherein the first electric-optical material overlaps the first signal transmission layer in a vertical direction;
  forming a second signal transmission layer and a second electric-optical material in a control unit and a plurality of computing units, wherein the second electric-optical material overlaps the second signal transmission layer in the vertical direction; and
  bonding the control unit and the computing units over the base material.

9. The method as claimed in claim 8, wherein bonding the control unit and the computing units comprises aligning the first signal transmission layer with the second signal transmission layer in the vertical direction.

10. The method as claimed in claim 8, wherein the second electric-optical material is formed in contact with the second signal transmission layer, and located between the second signal transmission layer and the first electric-optical material.

11. The method as claimed in claim 8, further comprising:
  forming a plurality of semiconductor devices in the control unit and the computing units, wherein the semiconductor devices overlap the second signal transmission layer in the vertical direction.

12. The method as claimed in claim 8, wherein the second signal transmission layer comprises a ring-shaped portion and a linear portion adjacent to the ring-shaped portion, and the ring-shaped portion overlaps the second electric-optical material in the vertical direction.

13. The method as claimed in claim 12, wherein when viewed in the vertical direction, the second electric-optical material extends beyond an edge of the ring-shaped portion.

14. The method as claimed in claim 13, wherein when viewed in the vertical direction, the second electric-optical material has a rectangular profile.

15. A method of forming a package structure, comprising:
  forming a first signal transmission layer and a second signal transmission layer in a base material;
  forming an electric-optical material in contact with the second signal transmission layer;
  bonding a control unit and a computing unit to the interposer, wherein the computing unit is disposed adjacent to the control unit;
  bonding a signal source to the interposer, wherein the computing unit is located between the control unit and the signal source, the signal source overlaps the first signal transmission layer and misaligned with the second signal transmission layer in a first direction.

16. The method as claimed in claim 15, wherein the second signal transmission layer is located between the first signal transmission layer and the electric-optical material.

17. The method as claimed in claim 15, wherein bonding the control unit and the computing unit to the interposer comprises:
  covering the second signal transmission layer and the electric-optical material by the control unit and the computing unit.

18. The method as claimed in claim 15, wherein a material of the second signal transmission layer is different from the electric-optical material.

19. The method as claimed in claim 15, further comprising:
  forming an additional electric-optical material in the control unit and the computing unit, wherein the additional electric-optical material overlaps the electric-optical material in the first direction.

20. The method as claimed in claim 19, wherein the additional electric-optical material has a rectangular profile in a top view.

* * * * *